US012777931B2

(12) United States Patent
Cho et al.

(10) Patent No.: US 12,777,931 B2
(45) Date of Patent: Oct. 27, 2026

(54) CHIP-ON-FILM PACKAGE

(71) Applicant: SAMSUNG ELECTRONICS CO., LTD., Suwon-si (KR)

(72) Inventors: Minwoo Cho, Suwon-si (KR); Seunghyun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 332 days.

(21) Appl. No.: 18/444,477

(22) Filed: Feb. 16, 2024

(65) Prior Publication Data

US 2025/0038064 A1 Jan. 30, 2025

(30) Foreign Application Priority Data

Jul. 27, 2023 (KR) ........................ 10-2023-0098352

(51) Int. Cl.

*H10W 40/25* (2026.01)
*H10W 70/65* (2026.01)
(Continued)

(52) U.S. Cl.

CPC ......... *H10W 40/255* (2026.01); *H10W 70/65* (2026.01); *H10W 74/00* (2026.01); (Continued)

(58) Field of Classification Search

CPC ... H10W 40/255; H10W 70/65; H10W 72/20; H10W 90/732; H10W 90/735; H10W 90/792; H10W 90/794; H10W 40/228; H10W 70/688; H10W 72/265; H10W 72/267; H10W 90/724; H05K 1/0206; H05K 1/189; H05K 1/0209; H05K 2201/0338; H05K 2201/09736

See application file for complete search history.

(56) References Cited

U.S. PATENT DOCUMENTS

| | | | |
|---|---|---|---|
| 6,534,722 | B2 | 3/2003 | Takaoka |
| 7,394,185 | B2 | 7/2008 | Ahn et al. |

(Continued)

FOREIGN PATENT DOCUMENTS

| | | |
|---|---|---|
| CN | 114068438 | 2/2022 |
| CN | 114864513 | 8/2022 |

(Continued)

*Primary Examiner* — Mouloucoulaye Inoussa
(74) *Attorney, Agent, or Firm* — Fish & Richardson P.C.

(57) ABSTRACT

The present disclosure relates to chip-on-film packages. An example chip-on-film package comprises a base film including a first surface and a second surface opposite to the first surface. The base film includes a protection layer adjacent to the first surface, a film substrate adjacent to the second surface, a plurality of lead lines between the film substrate and the protection layer, and a bonding layer between the plurality of lead lines and the protection layer. The chip-on-film package includes a semiconductor chip adjacent to the first surface, and a mold layer that covers a top surface and a lateral surface of the semiconductor chip. The first surface includes a circuit surface on which the semiconductor chip is disposed and a thermal conductive surface that faces the circuit surface when the base film is bent. The thermal conductive surface is in direct contact with a top surface of the mold layer.

16 Claims, 7 Drawing Sheets

(51) Int. Cl.
*H10W 74/00* (2026.01)
*H10W 90/00* (2026.01)

(52) U.S. Cl.
CPC ........ *H10W 90/732* (2026.01); *H10W 90/735* (2026.01); *H10W 90/792* (2026.01); *H10W 90/794* (2026.01)

(56) References Cited

U.S. PATENT DOCUMENTS

| | | | | |
|---|---|---|---|---|
| 9,029,851 | B2 | 5/2015 | Miyairi et al. | |
| 10,079,194 | B1 * | 9/2018 | Huang | B32B 27/281 |
| 10,692,891 | B2 | 6/2020 | Miyaguchi | |
| 11,538,800 | B2 | 12/2022 | Li et al. | |
| 2001/0033009 | A1 * | 10/2001 | Inoue | H05K 7/20963 257/668 |
| 2003/0020152 | A1 * | 1/2003 | Inoue | H10W 40/10 257/E23.101 |
| 2009/0273076 | A1 * | 11/2009 | Choi | H05K 1/0203 257/E23.101 |
| 2014/0306348 | A1 * | 10/2014 | Ahn | H05K 1/0281 257/773 |
| 2019/0363051 | A1 * | 11/2019 | Jung | H10W 40/22 |
| 2020/0211973 | A1 * | 7/2020 | Jung | H10W 40/22 |
| 2020/0303276 | A1 * | 9/2020 | Hwang | H05K 1/0209 |
| 2021/0255669 | A1 * | 8/2021 | Ha | G06F 1/1652 |
| 2022/0028777 | A1 * | 1/2022 | Kim | H10W 40/10 |
| 2022/0046785 | A1 * | 2/2022 | Kang | H05K 1/0206 |
| 2022/0139799 | A1 * | 5/2022 | Jung | H05K 1/0204 361/749 |
| 2023/0037785 | A1 * | 2/2023 | Lee | H10W 70/65 |
| 2023/0080328 | A1 | 3/2023 | Jung | |
| 2023/0178450 | A1 * | 6/2023 | Jo | H10K 59/131 257/678 |
| 2023/0335482 | A1 * | 10/2023 | Cho | H10W 40/251 |
| 2023/0369265 | A1 * | 11/2023 | Shin | H10W 70/65 |

FOREIGN PATENT DOCUMENTS

| | | |
|---|---|---|
| JP | 2007-150168 | 6/2007 |
| KR | 10-2020-0141321 | 12/2020 |

* cited by examiner

CHIP-ON-FILM PACKAGE

CROSS-REFERENCE TO RELATED APPLICATION

This application claims priority under 35 U.S.C. § 119 to Korean Patent Application No. 10-2023-0098352 filed on Jul. 27, 2023, in the Korean Intellectual Property Office, the disclosure of which is hereby incorporated by reference in its entirety.

BACKGROUND

A chip-on-film (COF) package technique has been developed to use a flexible film substrate in order to cope with recent trend toward smaller, thinner, and lighter electronic products. When a high-resolution display device is implemented with the COF technology, driving frequencies of televisions and monitors are increased to increase driving loads of the driver IC, which results in heat generation from integrated circuits. Various technical developments are being conducted to solve the heat generation issue.

SUMMARY

The present disclosure relates to chip-on-film packages, including a chip-on-film package with an increased heat dissipation area and a chip-on-film package with improved electrical properties and increased reliability.

An object of the present disclosure is not limited to the above-mentioned one, other objects which have not been mentioned above will be clearly understood to those skilled in the art from the following description.

In general, according to some aspects, a chip-on-film package comprises: a base film that has a first surface and a second surface opposite that are opposite to each other, wherein the base film includes a protection layer adjacent to the first surface, a film substrate adjacent to the second surface, a plurality of lead lines between the film substrate and the protection layer, and a bonding layer between the lead lines and the protection layer; a semiconductor chip adjacent to the first surface of the base film; and a mold layer that covers a top surface and a lateral surface of the semiconductor chip. The first surface of the base film includes: a circuit surface on which the semiconductor chip is disposed; and a thermal conductive surface that faces the circuit surface when the base film is bent. The thermal conductive surface is in direct contact with a top surface of the mold layer.

In general, according to some aspects, a chip-on-film package comprises: a base film that has a first surface and a second surface opposite that are opposite to each other, wherein the base film includes a protection layer adjacent to the first surface, a film substrate adjacent to the second surface, a plurality of lead lines between the film substrate and the protection layer, and a bonding layer between the lead lines and the protection layer; a semiconductor chip adjacent to the first surface of the base film; and a heat dissipation adhesive layer on a top surface of the semiconductor chip. The first surface of the base film includes: a circuit surface on which the semiconductor chip is disposed; and a thermal conductive surface that faces the circuit surface when the base film is bent. The thermal conductive surface is in direct contact with a top surface of the heat dissipation adhesive layer.

In general, according to some aspects, a chip-on-film package comprises: a base film that has a first surface and a second surface opposite that are opposite to each other, wherein the base film includes a protection layer adjacent to the first surface, a film substrate adjacent to the second surface, a plurality of lead lines between the film substrate and the protection layer, and a bonding layer between the lead lines and the protection layer; a semiconductor chip adjacent to the first surface of the base film; and a heat dissipation film that covers a top surface of the semiconductor chip and surrounds lateral surfaces of the semiconductor chip. The first surface of the base film includes: a circuit surface on which the semiconductor chip is disposed; and a thermal conductive surface that faces the circuit surface when the base film is bent. The thermal conductive surface is in direct contact with a top surface of the heat dissipation film.

DETAILED DESCRIPTION

Some implementations of the present disclosure will now be described in detail with reference to the accompanying drawings to aid in clearly explaining the present disclosure.

Figure 1:
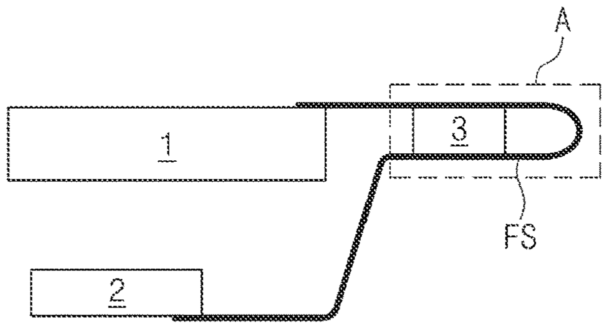
FIG. 1 illustrates a conceptual diagram showing an example of a chip-on-film package.
Figure 2:
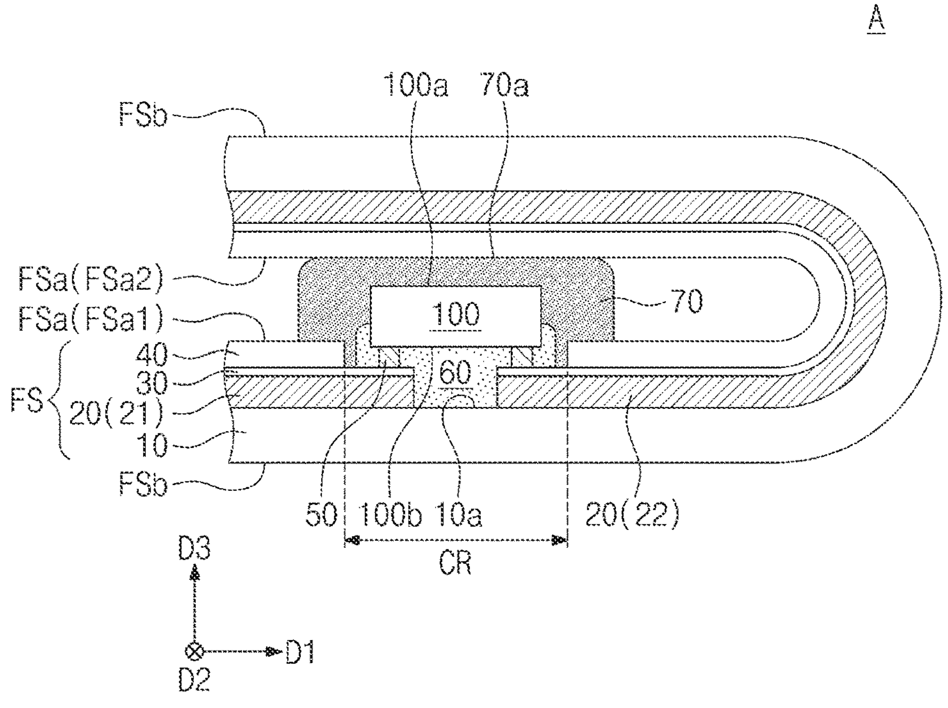
FIG. 2 illustrates an example enlarged cross-sectional view of section A depicted in FIG. 1.

FIG. 1 illustrates a conceptual diagram showing an example of a chip-on-film package. FIG. 2 illustrates an example enlarged cross-sectional view of section A depicted in FIG. 1.

Referring to FIG. 1, a display device 1, a circuit substrate 2, and a chip-on-film package 3 are connected through a base film FS. One end of the base film FS is connected to the circuit substrate 2, and another end of the base film FS is connected to the display device 1. The circuit substrate 2 is, for example, a printed circuit board (PCB) or a flexible printed circuit board (FPCB). The display device 1 is, for example, a display panel. The chip-on-film package 3 includes a semiconductor chip (see 100 of FIG. 2). The semiconductor chip 100 is, for example, a display driver IC (DDI) that drives the display panel. For example, the semiconductor chip 100 generates image signals by using data signals transferred from a timing controller, and outputs the image signals to the display panel. For another example, the semiconductor chip 100 is a timing controller connected to the display driver IC.

Referring to FIG. 2, the chip-on-film package 3 includes a base film FS. The base film FS has a first surface FSa and a second surface FSb that are opposite to each other along a third direction D3 perpendicular to a top surface 10*a* of a film substrate 10. The base film FS includes a protection layer 40 adjacent to the first surface FSa, a film substrate 10 adjacent to the second surface FSb, lead lines 20 between the film substrate 10 and the protection layer 40, and a bonding layer 30 between the lead lines 20 and the protection layer 40.

The film substrate 10 may be a flexible elastic substrate. The film substrate 10 may include a polymer material, for example, polyimide. The film substrate 10 may be bendable.

The base film FS may include a chip region CR. For example, the chip region CR may be an area on which the semiconductor chip 100 is disposed. The chip region CR may extend into the base film FS from the first surface FSa toward the second surface FSb of the base film FS. The chip region CR may penetrate the protection layer 40, the bonding layer 30, and the lead lines 20, and may expose the top surface 10*a* of the film substrate 10.

The semiconductor chip 100 may be disposed in the chip region CR of the base film FS. The semiconductor chip 100 may have a top surface 100*a* and a bottom surface 100*b* that are opposite to each other in the third direction D3. Although not shown, the semiconductor chip 100 may include chip pads on the bottom surface 100*b* of the semiconductor chip 100, and may include a passivation layer that exposes the chip pads. The passivation layer may include a dielectric material. The passivation layer may include, for example, at least one selected from silicon oxide and silicon nitride.

The lead lines 20 may be disposed on the top surface 10*a* of the film substrate 10. The lead lines 20 may include input lines 21 and output lines 22. The input lines 21 may be spaced apart and electrically separated from the output lines 22. The input lines 21 may extend in a direction opposite to that of the output lines 22. For example, ends of the input lines 21 may be electrically connected to the semiconductor chip 100, and other ends of the output lines 22 may extend in a direction opposite to a first direction D1 parallel to the top surface 10*a* of the film substrate 10. Ends of the output lines 22 may be electrically connected to the semiconductor chip 100, and other ends of the output lines 22 may extend in the first direction D1. The input lines 21 and the output lines 22 may extend onto the chip region CR to come into electrical connection with the semiconductor chip 100. The input lines 21 may be electrically connected to the circuit substrate 2, and the output lines 22 may be electrically connected to the display device 1. The input lines 21 and the output lines 22 may include a conductive metallic material, such as at least one selected from copper (Cu) and aluminum (Al). In some implementations, neither the input lines 21 nor the output lines 22 may extend onto a central area of the chip region CR.

The bonding layer 30 may be disposed on the lead lines 20. In some implementations, the bonding layer 30 may not extend onto the central area of the chip region CR. The bonding layer 30 may include, for example, tin (Sn). The bonding layer 30 may prevent oxidation of the lead lines 20, and thus the chip-on-film package (see 3 of FIG. 1) may improve in electrical properties.

The semiconductor chip 100 may be provided with connection terminals 50 on the bottom surface 100*b* thereof. The connection terminals 50 may be electrically connected through the bonding layer 30 to corresponding lead lines 20. The semiconductor chip 100 may be electrically connected through the connection terminals 50 to the lead lines 20. The connection terminals 50 may include a conductive metallic material, such as at least one selected from gold, nickel, tin, and copper. The connection terminals 50 may include at least one selected from solders, pillars, and bumps.

The protection layer 40 may be disposed on a top surface of the bonding layer 30. The protection layer 40 may not extend onto the chip region CR of the base film FS. The protection layer 40 may include a dielectric material, such as a solder resist material. The protection layer 40 may protect the lead lines 20. For example, the protection layer 40 may prevent the input lines 21 and the output lines 22 from oxidation or short-circuit that can occur during an annealing process.

An underfill layer 60 may be provided on the top surface 10*a* of the film substrate 10. The underfill layer 60 may fill a space between the film substrate 10 and the semiconductor chip 100. The underfill layer 60 may extend onto the bonding layer 30 to cover a portion of the bonding layer 30. The underfill layer 60 may partially cover a lateral surface of the semiconductor chip 100. The underfill layer 60 may cover and encapsulate the connection terminals 50. The underfill layer 60 may protect the connection terminals 50 from the outside, and may prevent contact between the connection terminals 50. The underfill layer 60 may include a dielectric polymer material, such as an epoxy-based thermosetting polymer material.

A mold layer 70 may be disposed to cover the top surface 100*a* and the lateral surface of the semiconductor chip 100. The mold layer 70 may cover the underfill layer 60 and a portion of the protection layer 40. On the chip region CR, the mold layer 70 may extend between the underfill layer 60 and the protection layer 40. The mold layer 70 may include, for example, a silicon-based thermosetting polymer material.

The base film FS may be flexible and bendable. The first surface FSa of the base film FS may include a circuit surface FSa1 on which the semiconductor chip 100 is disposed and a thermal conductive surface FSa2 that faces the circuit surface FSa1 when the base film FS is bent. The thermal conductive surface FSa2 may be in direct contact with a top surface 70*a* of the mold layer 70.

The chip-on-film package 3 may be configured in such a way that heat generated from the semiconductor chip 100 may be conducted in opposite directions through the base film FS connected to the display device 1 and the circuit substrate 2, and that the heat may be discharged by convection at a surface of the base film FS. Therefore, an increase in contact area between a heat source (or the semiconductor chip 100) and the base film FS may lead to an increase in heat dissipation effect. However, the base film FS may have a thermal resistance in a horizontal direction, and thus there may be a problem with the base film FS that prevents heat from spreading throughout the base film FS and reduces heat dissipation efficiency. According to the present disclosure, the base film FS may be bent to cause the thermal conductive surface FSa2 of the first surface FSa to directly contact the top surface 70*a* of the mold layer 70, and thus there may be an increase in contact area with a heat source. For example, the base film FS may be in physical contact with not only the circuit surface FSa1 below the heat source but also the thermal conductive surface FSa2 above the heat source, which may result in an increase in contact area with the heat source and in heat dissipation efficiency. In addition, it may be possible to omit a process for manufacturing or attaching other material to increase the heat dissipation effect.

FIGS. 3 to 7 illustrate cross-sectional views showing an example of a method of fabricating a chip-on-film package depicted in FIG. 2. A duplicate explanation of the chip-on-film package discussed with reference to FIGS. 1 and 2 will be omitted in the interest of brevity of description.

Figure 3:
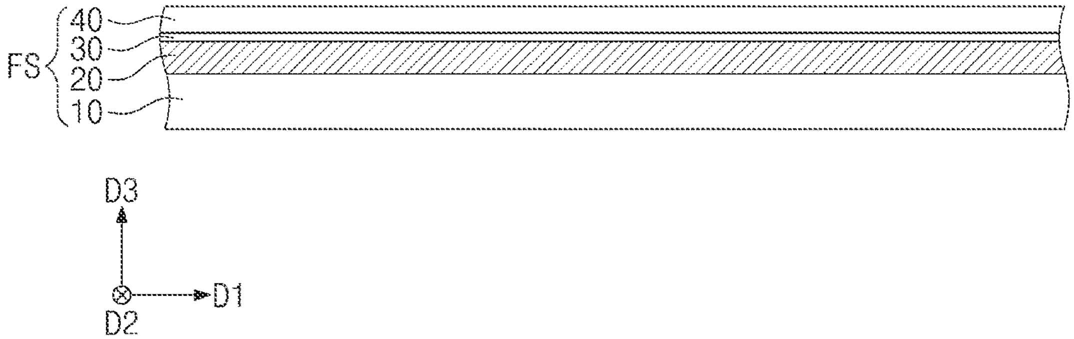
FIGS. 3 to 7 illustrate cross-sectional views showing an example of a method of fabricating a chip-on-film package depicted in FIG. 2.

Referring to FIG. 3, a lead line 20, a bonding layer 30, and a protection layer 40 are sequentially formed on a film substrate 10, thereby manufacturing a base film FS. The lead line 20, the bonding layer 30, and the protection layer 40 are formed by using a film formation technique such as chemical vapor deposition (CVD) or physical vapor deposition (PVD).

Figure 4:
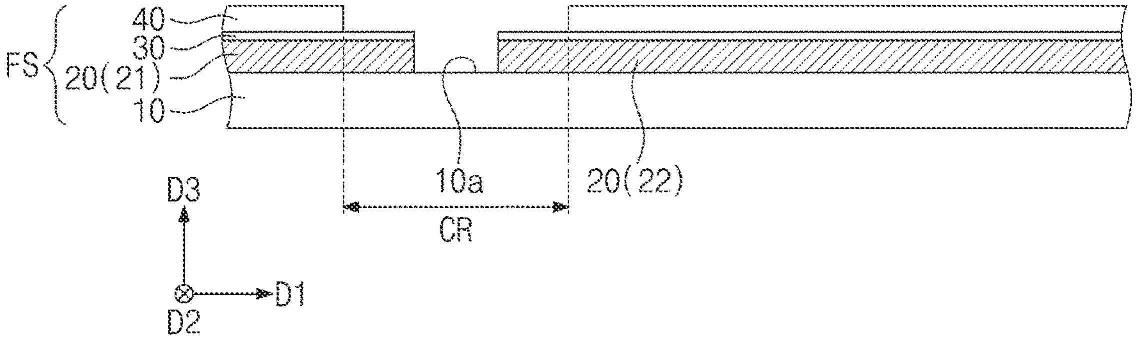

Referring to FIG. 4, the protection layer 40, the bonding layer 30, and the lead line 20 are partially etched. The protection layer 40 is etched on a chip region CR on which a semiconductor chip (see 100 of FIG. 5) will be disposed, and the bonding layer 30 and the lead line 20 are etched on a central area of the chip region CR. The protection layer 40, the bonding layer 30, and the lead lines 20 are partially etched to expose a top surface 10*a* of the film substrate 10 on the central area of the chip region CR. The partial etching of the lead line 20 divides an input line 21 and an output line 22 from each other. The partial etching of the protection layer 40, the bonding layer 30, and the lead line 20 includes forming a photoresist pattern PR, using the photoresist pattern PR as an etching mask to anisotropically etch the protection layer 40, the bonding layer 30, and the lead line 20, and removing the photoresist pattern PR (PR strip).

Figure 5:
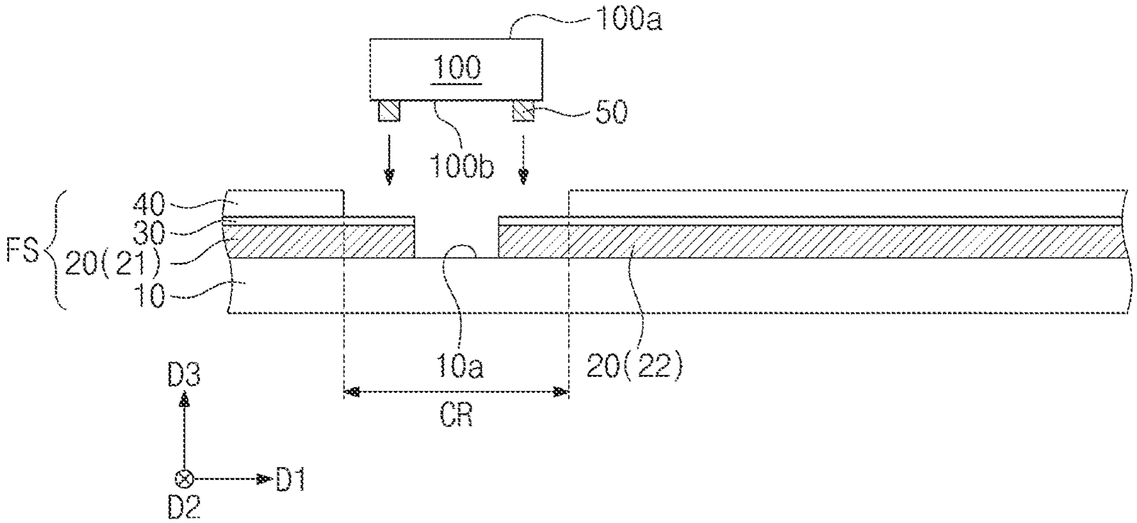

Referring to FIG. 5, a semiconductor chip 100 is mounted on the chip region CR of the base film FS. The mounting of the semiconductor chip 100 includes forming connection terminals 50 on a bottom surface 100*b* of the semiconductor chip 100, and electrically connecting the connection terminals 50 to the input line 21 and the output line 22. The connection terminals 50 are in contact with the bonding layer 30, and are connected through the bonding layer 30 to the input line 21 and the output line 22.

Figure 6:
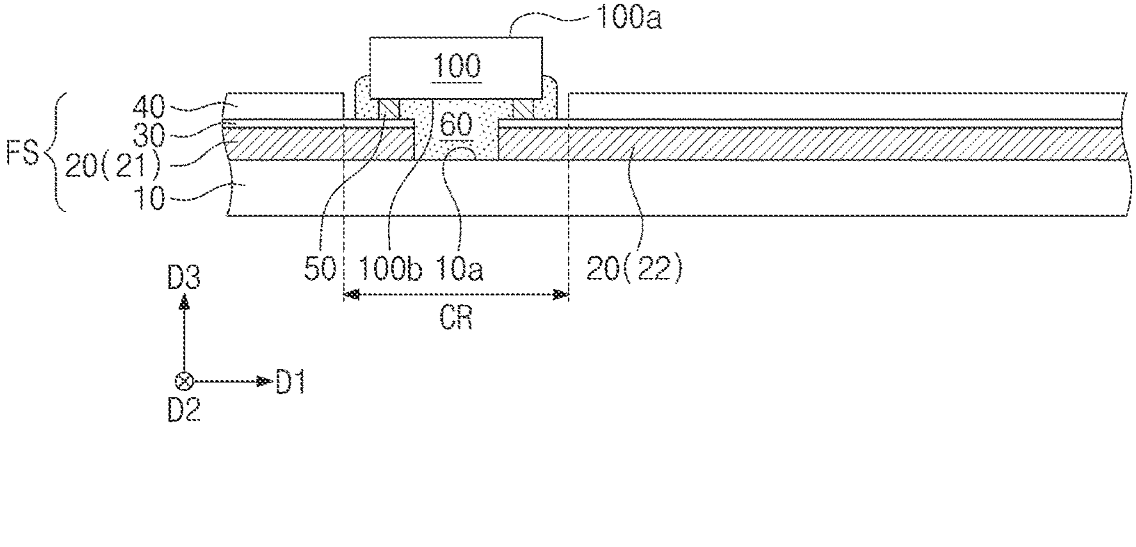

Referring to FIG. 6, an underfill layer 60 is formed to fill a space between the semiconductor chip 100 and the film substrate 10. The underfill layer 60 is formed on the top surface 10*a* of the film substrate 10, and extends onto the bonding layer 30 to cover a portion of the bonding layer 30. The underfill layer 60 partially covers a lateral surface of the semiconductor chip 100. The underfill layer 60 covers the connection terminals 50.

Figure 7:
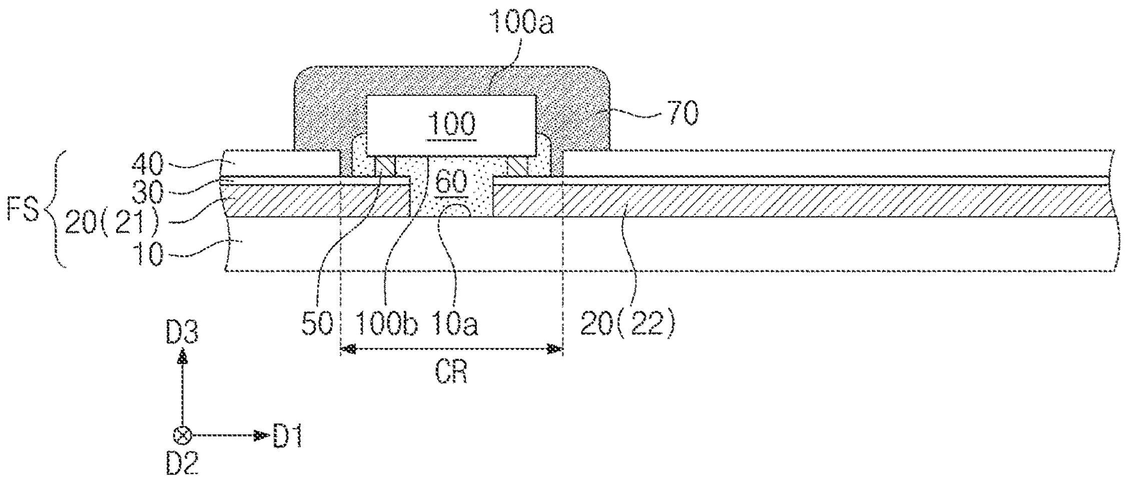

Referring to FIG. 7, a mold layer 70 is formed to cover a top surface 100*a* and the lateral surface of the semiconductor chip 100. The mold layer 70 covers a portion of the protection layer 40, and extends between the protection layer 40 and the underfill layer 60.

Referring back to FIG. 2, the base film FS may be bent to allow a circuit surface FSa1 of a first surface FSa to face a thermal conductive surface FSa2 of the first surface FSa. The thermal conductive surface FSa2 may be in direct contact with a top surface 70*a* of the mold layer 70. The base film FS may be bent to cause the thermal conductive surface FSa2 to contact the mold layer 70, and then an annealing process may be performed to attach the thermal conductive surface FSa2 to the mold layer 70.

Figure 8:
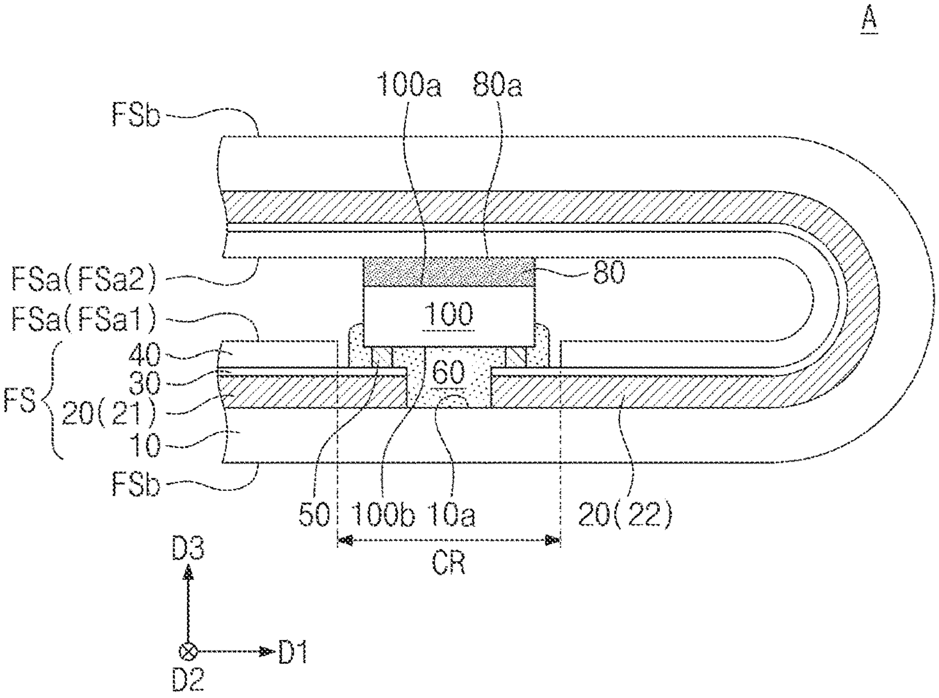
FIG. 8 illustrates a cross-sectional view showing an example of a chip-on-film package.

FIG. 8 illustrates a cross-sectional view showing an example of a chip-on-film package. For brevity of description, a repetitive explanation will be omitted.

Referring to FIG. 8, a heat dissipation adhesive layer 80 is disposed on the top surface 100*a* of the semiconductor chip 100. The heat dissipation adhesive layer 80 includes, for example, a silicon-based material containing thermal conductive fillers.

The base film FS may be flexible and bendable. The first surface FSa of the base film FS may include a circuit surface FSa1 on which the semiconductor chip 100 is disposed and a thermal conductive surface FSa2 that faces the circuit surface FSa1 when the base film FS is bent. The thermal conductive surface FSa2 may be in direct contact a top surface 80*a* of the heat dissipation adhesive layer 80.

According to the present disclosure, to increase a heat dissipation, the base film FS may be bent to cause the thermal conductive surface FSa2 to contact an upper portion of a heat source. When the heat source and the thermal conductive surface FSa2 are in contact with each other, a surface roughness may lead to the occurrence of fine crack or void between contact surfaces. In this case, the fine crack or the void may have therein air whose thermal conductivity is low, and thus there may be a reduction in heat dissipation efficiency. According to some implementations, as shown in FIG. 8, the heat dissipation adhesive layer 80 may be disposed between the top surface 100*a* of the semiconductor chip 100 as a heat source and the thermal conductive surface FSa2 of the first surface FSa of the base film FS. The heat dissipation adhesive layer 80 may include a material for decreasing an interfacial thermal resistance, and may fill the fine crack or the void to increase a heat dissipation effect.

Figure 9A:
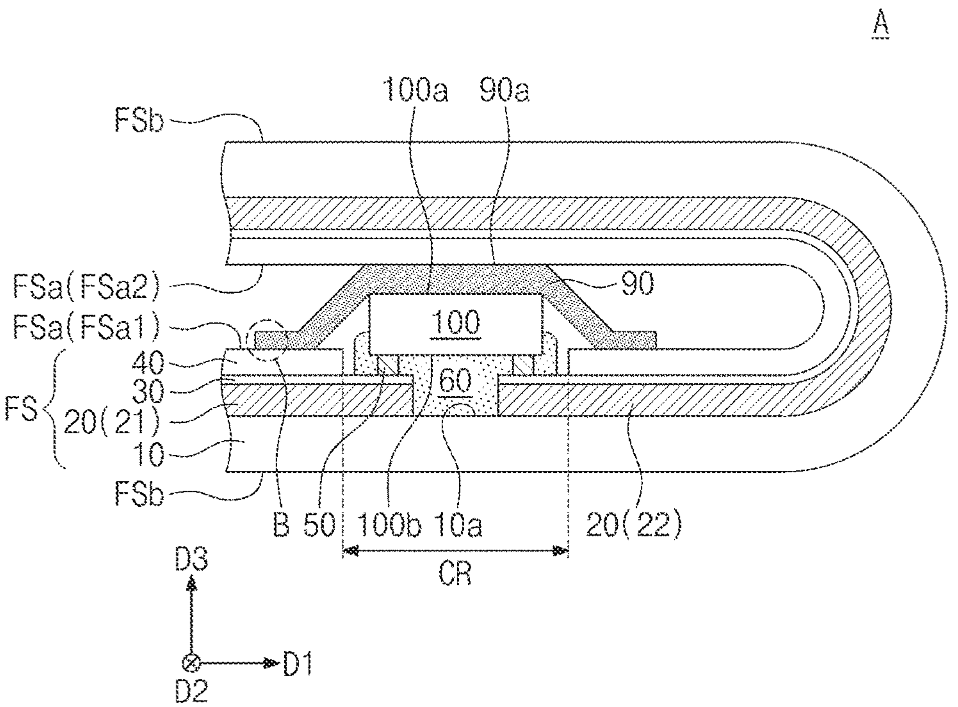
FIG. 9A illustrates a cross-sectional view showing another example of a chip-on-film package.
Figure 9B:
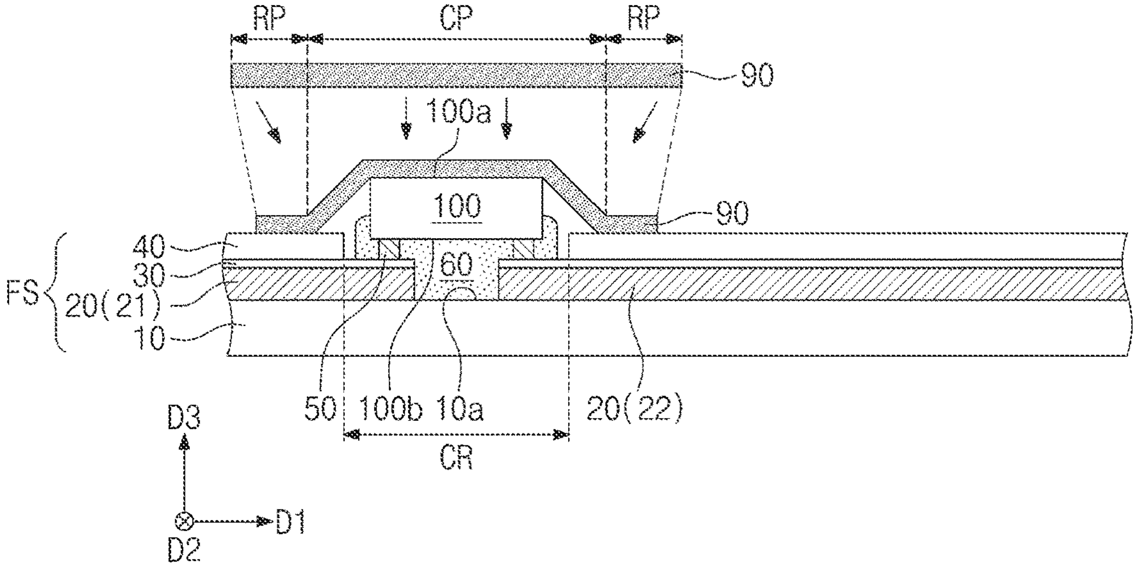
FIG. 9B illustrates an example cross-sectional view showing a portion of FIG. 9A.
Figure 9C:
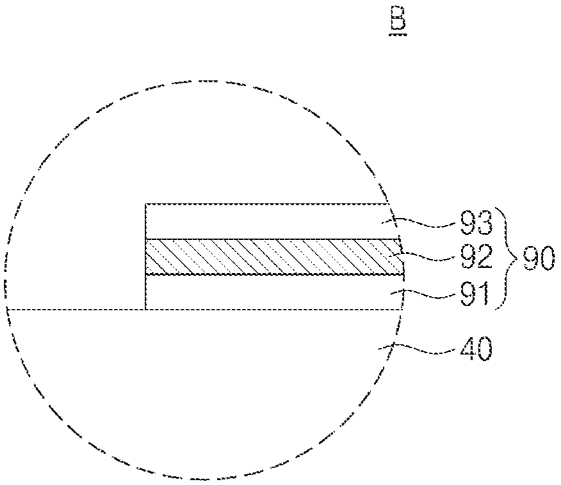
FIG. 9C illustrates an example enlarged view showing section B of FIG. 9A.

FIG. 9A illustrates a cross-sectional view showing another example of a chip-on-film package. FIG. 9B illustrates an example cross-sectional view showing a portion of FIG. 9A. FIG. 9C illustrates an example enlarged view showing section B of FIG. 9A. For brevity of description, a repetitive explanation will be omitted.

Referring to FIGS. 9A and 9B, a heat dissipation film 90 is disposed to cover the top surface 100*a* of the semiconductor chip 100 and to surround the lateral surfaces of the semiconductor chip 100. Referring together to FIGS. 9A and 9B, the heat dissipation film 90 includes a central part CP that covers the semiconductor chip 100 and a peripheral part RP that surrounds the central part CP. The peripheral part RP of the heat dissipation film 90 is attached to the protection layer 40. The central part CP of the heat dissipation film 90 corresponds to a portion that provides an internal space in which the semiconductor chip 100 is accommodated on the base film FS. For example, the central part CP of the heat dissipation film 90 overlaps an entirety of the semiconductor chip 100. The central part CP of the heat dissipation film 90 is in contact with the top surface 100*a* of the semiconductor chip 100. Therefore, the central part CP of the heat dissipation film 90 directly receives heat from the semiconductor chip 100 and may outwardly discharge the heat through a top surface 90*a* of the heat dissipation film 90.

The heat dissipation film 90 may be formed of a multilayer film. The heat dissipation film 90 may include an adhesive layer 91, a thermal conductive layer 92, and an upper layer 93 that are sequentially stacked.

The adhesive layer 91 of the heat dissipation film 90 may be in contact with the top surface 100*a* of the semiconductor chip 100. The adhesive layer 91 may be provided in the form of an adhesive film or an adhesive thin layer. For example, the adhesive layer 91 may include an adhesive polymer. For another example, the adhesive layer 91 may include a material of which thermal conductivity is high or in which are dispersed particles whose thermal conductivity is high. The adhesive layer 91 may include, for example, an acrylic PSA (pressure sensitive adhesive).

The thermal conductive layer 92 of the heat dissipation film 90 may be provided to receive heat generated from the semiconductor chip 100 and to outwardly discharge the heat. The thermal conductive layer 92 may be formed either of a metallic material, such as copper (Cu), aluminum (Al), or stainless steels, or formed of a non-metallic material with high thermal conductivity.

The upper layer 93 of the heat dissipation film 90 may be provided to protect the thermal conductive layer 92 and the semiconductor chip 100 within the heat dissipation film 90. The upper layer 93 may include a dielectric material, such as polyimide (PI).

The base film FS may be flexible and bendable. The first surface FSa of the base film FS may include a circuit surface FSa1 on which the semiconductor chip 100 is disposed and a thermal conductive surface FSa2 that faces the circuit surface FSa1 when the base film FS is bent. The thermal conductive surface FSa2 may be in direct contact the top surface 90*a* of the heat dissipation film 90.

In some implementations, as shown in FIG. 9A, the heat dissipation film 90 may be disposed between the top surface 100*a* of the semiconductor chip 100 as a heat source and the thermal conductive surface FSa2 of the first surface FSa of the base film FS. As the heat dissipation film 90 includes a material having high thermal conductivity is high, heat generated from the semiconductor chip 100 may be effectively transferred to the thermal conductive surface FSa2 and outwardly discharged by convection at the base film FS.

Referring to FIGS. 9A and 9B, a heat dissipation film 90 is provided which includes an adhesive layer 91, a thermal conductive layer 92, and an upper layer 93 that are sequentially stacked. The heat dissipation film 90 has a central part CP that covers the semiconductor chip 100 and a peripheral part RP that surrounds the central part CP. Afterwards, as indicated by arrows, the heat dissipation film 90 approaches to be attached to the base film FS.

Figure 10:
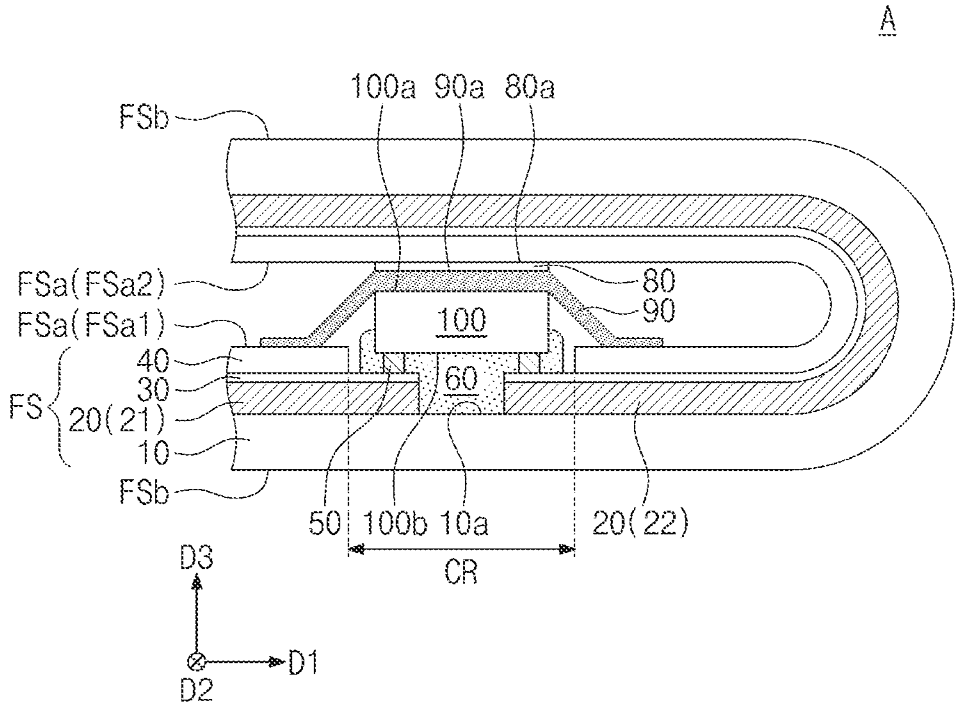
FIG. 10 illustrates a cross-sectional view showing another example of a chip-on-film package.

FIG. 10 illustrates a cross-sectional view showing another example of a chip-on-film package. For brevity of description, a repetitive explanation will be omitted.

Referring to FIG. 10, a heat dissipation film 90 is disposed to cover the top surface 100*a* of the semiconductor chip 100 and to surround the lateral surfaces of the semiconductor chip 100. The first surface FSa of the base film FS includes a circuit surface FSa1 on which the semiconductor chip 100 is disposed and a thermal conductive surface FSa2 that faces the circuit surface FSa1 when the base film FS is bent. A heat dissipation adhesive layer 80 is interposed between the heat dissipation film 90 and the thermal conductive surface FSa2 of the first surface FSa of the base film FS. The heat dissipation film 90 is substantially the same as the heat dissipation film 90 discussed with reference to FIGS. 9A to 9C. The heat dissipation adhesive layer 80 is substantially the same as the heat dissipation adhesive layer 80 discussed with reference to FIG. 8.

In some implementations, the heat dissipation film 90 may be disposed between the top surface 100*a* of the semiconductor chip 100 and the thermal conductive surface FSa2 of the first surface FSa of the base film FS. In addition, according to some implementations, as shown in FIG. 10, the heat dissipation adhesive layer 80 may further be included between the heat dissipation film 90 and the thermal conductive surface FSa2. As discussed with reference to FIG. 8, the heat dissipation adhesive layer 80 may include a material for decreasing an interfacial thermal resistance as discussed with reference to FIG. 8, and may increase a heat dissipation effect between the thermal conductive surface FSa2 and the top surface 90*a* of the heat dissipation film 90. Therefore, the heat dissipation film 90 may be included to increase a heat dissipation effect as discussed with reference to FIG. 9A, and the heat dissipation adhesive layer 80 may further be included to maximize the heat dissipation effect.

In a chip-on-film package according to the present disclosure, a base film may be bent to contact an upper portion of a semiconductor chip as a heat source. This configuration may lead to an increase in effective area of heat dissipation, and thus there may be an increase in heat dissipation effect and a reduction in manufacturing cost.

Effects of the present disclosure are not limited to the mentioned above, other effects which have not been mentioned above will be clearly understood to those skilled in the art from the following description.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Although some example implementations of the present disclosure have been discussed with reference to accompanying figures, it will be understood that various changes in form and details may be made therein without departing from the spirit and scope of the present disclosure. It will be apparent to those skilled in the art that various substitution, modifications, and changes may be thereto without departing from the scope and spirit of the present disclosure.

What is claimed is:

1. A chip-on-film package comprising:

a base film that includes a first surface and a second surface opposite to the first surface, wherein the base film includes a protection layer adjacent to the first surface, a film substrate adjacent to the second surface, a plurality of lead lines between the film substrate and the protection layer, and a bonding layer between the plurality of lead lines and the protection layer;

a semiconductor chip adjacent to the first surface of the base film; and a mold layer that covers a top surface and a lateral surface of the semiconductor chip, wherein the first surface of the base film includes a circuit surface on which the semiconductor chip is disposed, and a thermal conductive surface that faces the circuit surface when the base film is bent, wherein the thermal conductive surface is in direct contact with a top surface of the mold layer.

2. The chip-on-film package of claim 1, wherein the base film includes a chip region that extends into the base film from the first surface toward the second surface, wherein the chip region extends through the protection layer, the bonding layer, and the plurality of lead lines and exposes the film substrate, and wherein the semiconductor chip is in the chip region.

3. The chip-on-film package of claim 2, comprising a connection terminal on a bottom surface of the semiconductor chip, wherein the connection terminal is in contact with the bonding layer on the chip region.

4. The chip-on-film package of claim 3, comprising an underfill layer that fills a space between the semiconductor chip and the film substrate and that extends onto the bonding layer to cover the connection terminal.

5. The chip-on-film package of claim 4, wherein the underfill layer includes an epoxy-based thermosetting polymer material.

6. The chip-on-film package of claim 1, wherein the film substrate is a flexible substrate including polyimide.

7. The chip-on-film package of claim 1, wherein the mold layer includes a silicon-based thermosetting polymer material.

8. A chip-on-film package comprising:

a base film that includes a first surface and a second surface opposite to the first surface, wherein the base film includes a protection layer adjacent to the first surface, a film substrate adjacent to the second surface, a plurality of lead lines between the film substrate and the protection layer, and a bonding layer between the plurality of lead lines and the protection layer;

a semiconductor chip adjacent to the first surface of the base film; and a heat dissipation adhesive layer on a top surface of the semiconductor chip, wherein the first surface of the base film includes a circuit surface on which the semiconductor chip is disposed, and a thermal conductive surface that faces the circuit surface when the base film is bent, wherein the thermal conductive surface is in direct contact with a top surface of the heat dissipation adhesive layer.

9. The chip-on-film package of claim 8, wherein the base film includes a chip region that extends into the base film from the first surface toward the second surface, wherein the chip region extends through the protection layer, the bonding layer, and the plurality of lead lines and exposes the film substrate, and wherein the semiconductor chip is in the chip region.

10. The chip-on-film package of claim 9, comprising a connection terminal on a bottom surface of the semiconductor chip, wherein the connection terminal is in contact with the bonding layer on the chip region.

11. The chip-on-film package of claim 10, comprising an underfill layer that fills a space between the semiconductor chip and the film substrate and that extends onto the bonding layer to cover the connection terminal.

12. The chip-on-film package of claim 8, wherein the heat dissipation adhesive layer includes a silicon-based material containing a thermal conductive filler.

13. A chip-on-film package comprising:

a base film that includes a first surface and a second surface opposite to the first surface, wherein the base film includes a protection layer adjacent to the first surface, a film substrate adjacent to the second surface, a plurality of lead lines between the film substrate and the protection layer, and a bonding layer between the plurality of lead lines and the protection layer;

a semiconductor chip adjacent to the first surface of the base film; and a heat dissipation film that covers a top surface of the semiconductor chip and surrounds lateral surfaces of the semiconductor chip, wherein the first surface of the base film includes a circuit surface on which the semiconductor chip is disposed, and a thermal conductive surface that faces the circuit surface when the base film is bent, wherein the thermal conductive surface is in direct contact with a top surface of the heat dissipation film.

14. The chip-on-film package of claim 13, wherein the base film includes a chip region that extends into the base film from the first surface toward the second surface, wherein the chip region extends through the protection layer, the bonding layer, and the plurality of lead lines and exposes the film substrate, and wherein the semiconductor chip is in the chip region.

15. The chip-on-film package of claim 14, comprising a connection terminal on a bottom surface of the semiconductor chip, wherein the connection terminal is in contact with the bonding layer on the chip region.

16. The chip-on-film package of claim 13, wherein the heat dissipation film includes an adhesive layer, a thermal conductive layer, and an upper layer that are sequentially stacked, and wherein the upper layer includes a dielectric material.

* * * * *